(12) United States Patent
Lee et al.

(10) Patent No.: US 7,868,648 B2
(45) Date of Patent: Jan. 11, 2011

(54) ON-DIE TERMINATION CIRCUIT, METHOD OF CONTROLLING THE SAME, AND ODT SYNCHRONOUS BUFFER

(75) Inventors: Dong-jin Lee, Seoul (KR); Jin-hyung Cho, Suwon-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 12/071,848

(22) Filed: Feb. 27, 2008

(65) Prior Publication Data

US 2008/0204071 A1    Aug. 28, 2008

(30) Foreign Application Priority Data

Feb. 27, 2007    (KR) ...................... 10-2007-0019925

(51) Int. Cl.
*H03K 17/16*    (2006.01)
*H03K 19/003*    (2006.01)

(52) U.S. Cl. ........................ 326/30; 326/40; 326/113; 365/189.05; 365/233.11

(58) Field of Classification Search .................. 326/30, 326/112–113; 365/189.05, 233.1, 233.11, 365/233.12

See application file for complete search history.

(56) References Cited

U.S. PATENT DOCUMENTS

| 6,928,007 | B2* | 8/2005 | Jin ............................. 365/194 |
| 7,498,834 | B2* | 3/2009 | Kim ............................ 326/30 |
| 2004/0141391 | A1* | 7/2004 | Lee et al. ..................... 365/200 |
| 2004/0240298 | A1* | 12/2004 | Jin ............................. 365/222 |
| 2005/0134304 | A1* | 6/2005 | Lee ............................. 326/30 |
| 2005/0180229 | A1* | 8/2005 | Jin ............................. 365/194 |
| 2005/0248375 | A1* | 11/2005 | Jung ........................... 327/108 |
| 2007/0126469 | A1* | 6/2007 | Kim et al. ..................... 326/30 |
| 2009/0102510 | A1* | 4/2009 | Park ............................ 326/30 |

FOREIGN PATENT DOCUMENTS

| KR | 10-0528164 | 11/2005 |
| KR | 10-20076-0089357 | 8/2006 |
| KR | 1020060089357 | 8/2006 |
| KR | 100625298 | 9/2006 |

OTHER PUBLICATIONS

Notice of Office Action dated Mar. 26, 2008 for corresponding Korean Application No. 10-2007-0019925.

\* cited by examiner

*Primary Examiner*—James H. Cho
*Assistant Examiner*—Jason M Crawford
(74) *Attorney, Agent, or Firm*—Harness, Dickey & Pierce, P.L.C.

(57) ABSTRACT

An on-die termination (ODT) circuit may include an ODT synchronous buffer and/or an ODT gate. The ODT synchronous buffer may be configured to generate a synchronous ODT command from an external ODT command in synchronization with a first clock signal delay-locked to an external clock signal. The ODT gate may be configured to generate signals for controlling ODT based on a second clock signal delay-locked to the external clock signal and the synchronous ODT command. The synchronous ODT command may be generated in a disabled period of the second clock signal.

7 Claims, 5 Drawing Sheets

ON-DIE TERMINATION CIRCUIT, METHOD OF CONTROLLING THE SAME, AND ODT SYNCHRONOUS BUFFER

PRIORITY STATEMENT

This application claims the benefit of priority to Korean Patent Application No. 10-2007-0019925, filed on Feb. 27, 2007, in the Korean Intellectual Property Office, the entire contents of which are incorporated herein in their entirety by reference.

BACKGROUND

1. Field

Example embodiments relate to an on-die termination (ODT) circuit of a semiconductor memory device and/or a method of controlling the same, and for example, to an ODT synchronous buffer of an ODT circuit and/or a method of controlling the same.

2. Description of Related Art

A frequency of a signal bus of a system employing a dynamic random access memory (DRAM) rapidly increases in order to achieve a higher-speed operation. Accordingly, various studies on a bus termination technique for solving an impedance mismatching problem to minimize signal integrity distortion have been carried out. These studies show that a method using on-die termination (ODT) may be more advantageous than a method using mother board termination (MBT) in systems having a stub bus structure.

ODT may include a termination structure in which bus termination is performed at input/output ports of a memory set in a memory module. An ODT circuit is an impedance matching circuit, which is also referred to as an on-chip termination circuit, and is located near a pad in an integrated circuit chip.

A period of time from if an external ODT command is applied to the ODT circuit to when ODT is carried out is defined as a clock latency.

SUMMARY

Example embodiments provide an on-die termination (ODT) circuit and/or an ODT synchronous buffer, which may more stably operate over a wider frequency range.

According to an example embodiment, an on-die termination (ODT) circuit may include an ODT synchronous buffer and/or an ODT gate. The ODT synchronous buffer may be configured to generate a synchronous ODT command from an external ODT command in synchronization with a first clock signal delay-locked to an external clock signal. The ODT gate may be configured to generate signals for controlling ODT based on a second clock signal delay-locked to the external clock signal and the synchronous ODT command. The synchronous ODT command may be generated in a disabled period of the second clock signal.

According to another example embodiment, an on-die termination (ODT) synchronous buffer may include a delay and/or a latch. The delay may be configured to delay a first clock signal delay-locked to an external clock signal to generate a first delayed clock signal. The latch may be configured to latch an external ODT command in response to the first delayed clock signal and output the latched external ODT command as a synchronous ODT command. The synchronous ODT command may be generated in a disabled period of a second clock signal, the second clock signal controlling an operation of an ODT gate configured to generate signals for controlling ODT.

According to an example embodiment, a method of controlling an on-die termination (ODT) circuit may include generating a synchronous ODT command from an external ODT command in synchronization with a first clock signal delay-locked to an external clock signal. Signals for controlling ODT based on a second clock signal delay-locked to the external clock signal and the synchronous ODT command may be generated. The synchronous ODT command may be generated in a disabled period of the second clock signal.

BRIEF DESCRIPTION OF THE DRAWINGS

The above and/or other aspects and advantages will become more apparent and more readily appreciated from the following detailed description of example embodiments taken in conjunction with the accompanying drawings of which.

DETAILED DESCRIPTION OF EXAMPLE EMBODIMENTS

Figure 1:
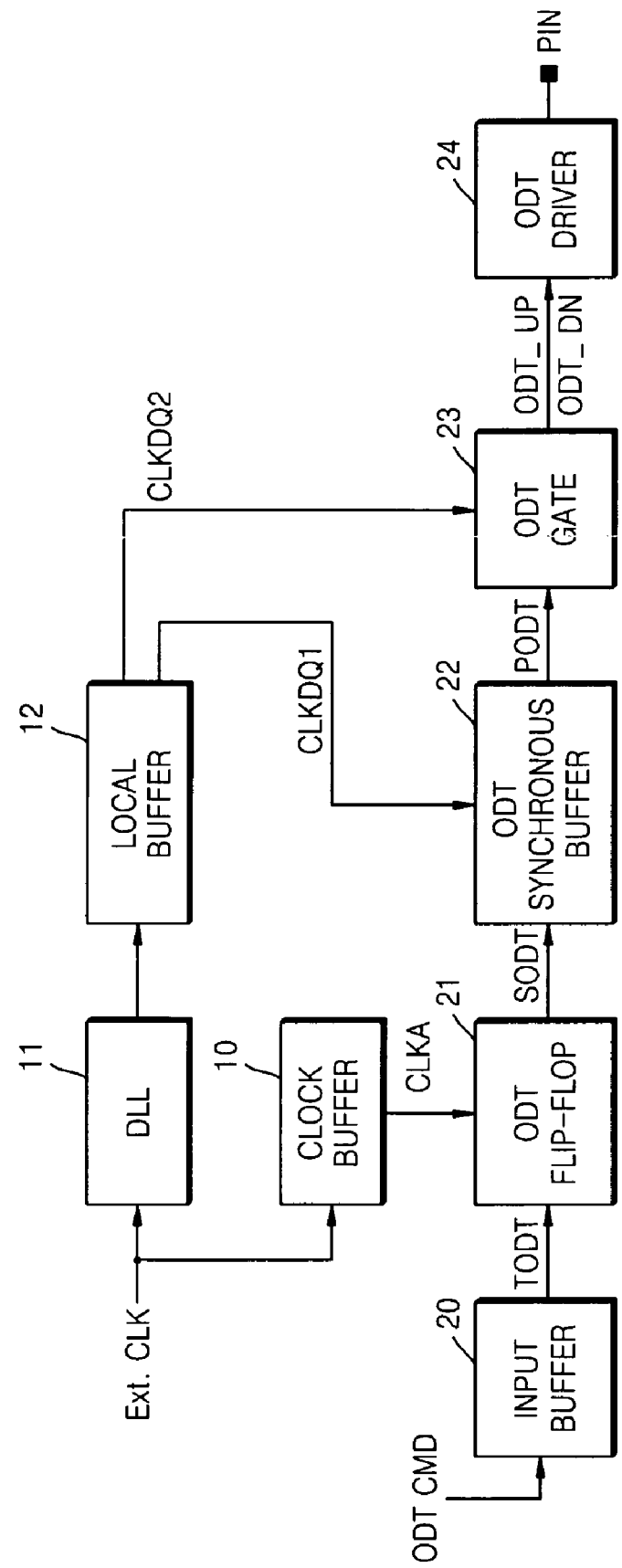
FIG. 1 is a block diagram of an on-die termination (ODT) circuit according to an example embodiment.

Example embodiments will now be described more fully hereinafter with reference to the accompanying drawings. Embodiments may, however, be in many different forms and should not be construed as being limited to the example embodiments set forth herein. Rather, these example embodiments are provided so that this disclosure will be thorough and complete, and will fully convey the scope to those skilled in the art. In the drawings, the thicknesses of layers and regions may be exaggerated for clarity.

It will be understood that when a component is referred to as being "on," "connected to" or "coupled to" another component, it can be directly on, connected to or coupled to the other component or intervening components may be present. In contrast, when a component is referred to as being "directly on," "directly connected to" or "directly coupled to" another component, there are no intervening components present. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the example embodiments.

Spatially relative terms, such as "beneath," "below," "lower," "above," "upper" and the like, may be used herein for ease of description to describe one component or feature's relationship to another component(s) or feature(s) as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, and/or components.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Reference will now be made to example embodiments, which are illustrated in the accompanying drawings, wherein like reference numerals refer to the like components throughout.

FIG. 1 is a block diagram of an on-die termination (ODT) circuit according to an example embodiment. Referring to FIG. 1, the ODT circuit may include a clock buffer 10, a delay locked loop (DLL) 11, a local buffer 12, an input buffer 20, an ODT flip-flop 21, an ODT synchronous buffer 22, an ODT gate 23, and/or an ODT driver 24. The ODT circuit may output data in synchronization with an external clock signal Ext CLK.

The clock buffer 10 may be used to convert a level of a clock signal. The clock buffer 10 may buffer the external clock signal Ext CLK to generate a buffered clock signal CLKA. The DLL 11 and operations of the DLL 11 are well-known in the art.

The local buffer 12 may receive the output signal of the DLL 11 and bypass the received signal to output a first clock signal CLKDQ1. The local buffer 12 may delay the output signal of the DLL 11 by a desired, or alternatively, a predetermined time (for example, half the period of the external clock signal Ext CLK), and output the delayed signal to generate a second clock signal CLKDQ2.

The input buffer 20 may convert a stub series terminated logic (SSTL) level of an external ODT command ODT CMD into a CMOS level. The ODT flip-flop 21 may receive an ODT command TODT output from the input buffer 20 and generate an output signal SODT synchronized with the buffered clock signal CLKA.

The ODT synchronous buffer 22 may receive the output signal SODT of the ODT flip-flop 21 and synchronize the output signal SODT with the first clock signal CLKDQ1, which is delay-locked to the external clock signal Ext CLK, to generate a synchronous ODT command PODT. The ODT gate 23 may pass and latch the synchronous ODT command PODT in response to the second clock signal CLKDQ2 having a desired, or alternatively, a predetermined phase difference with the first clock signal CLKDQ1 to generate an ODT up signal ODT_UP and an ODT down signal ODT_DN.

The ODT driver 24 may control turning on or off of a pull-up resistor and a pull-down resistor in response to the statuses of the ODT up signal ODT_UP and the ODT down signal ODT_DN to carry out an ODT driving operation in synchronization with the external clock signal Ext CLK.

Figure 2:
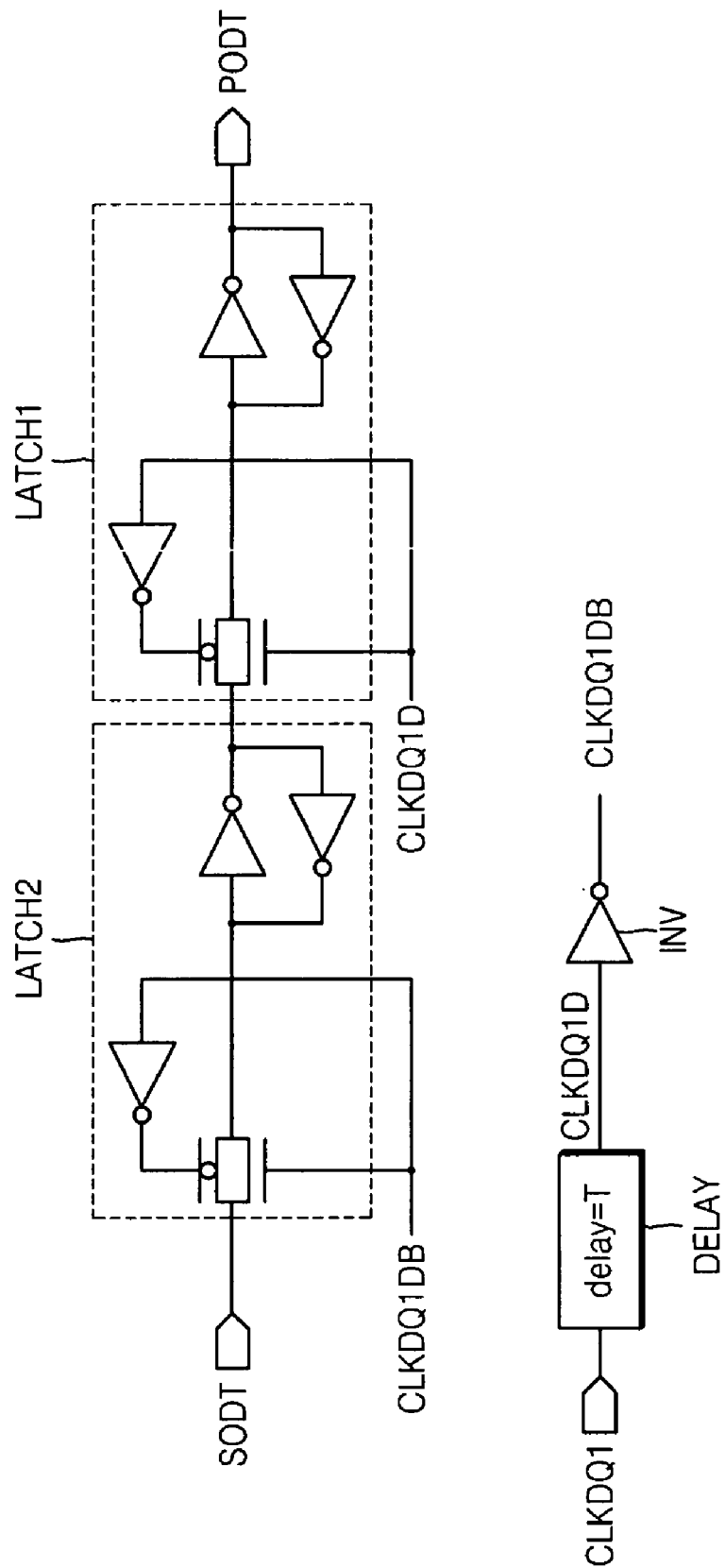
FIG. 2 is a circuit diagram of an ODT synchronous buffer which is compared to an ODT synchronous buffer according to an embodiment.

FIG. 2 is a circuit diagram of an ODT synchronous buffer which is used in a comparison to an ODT synchronous buffer according to an example embodiment described below. Referring to FIG. 2, the ODT synchronous buffer may include a delay DELAY, an inverter INV, a first latch LATCH1, and/or a second latch LATCH2. The delay DELAY may receive the first clock signal CLKDQ1 delay the received first clock signal CLKDQ1 by a desired, or alternatively, a predetermined time and output a signal CLKDQ1D. The inverter INV may invert the output signal of the delay DELAY and output a signal CLKDQ1DB. The first latch LATCH1 may latch the ODT command signal, e.g., the output signal SODT, according to the output signal CLKDQ1DB of the inverter INV. The second latch LATCH2 may latch the output signal of the first latch LATCH1 according to the output signal CLKDQ1D of the delay DELAY. In FIG. 2, CLKDQ1 is a clock signal corresponding to a DLL locking signal output from the local buffer 12 illustrated in FIG. 1.

The ODT synchronous buffer may output a synchronous ODT command PODT in synchronization with a rising edge of the output signal CLKDQ1D of the delay DELAY. The synchronous ODT command PODT may be input to the ODT gate 23 illustrated in FIG. 1 and output in synchronization with a rising edge or a falling edge of the second clock signal CLKDQ2 illustrated in FIG. 1.

Figure 3:
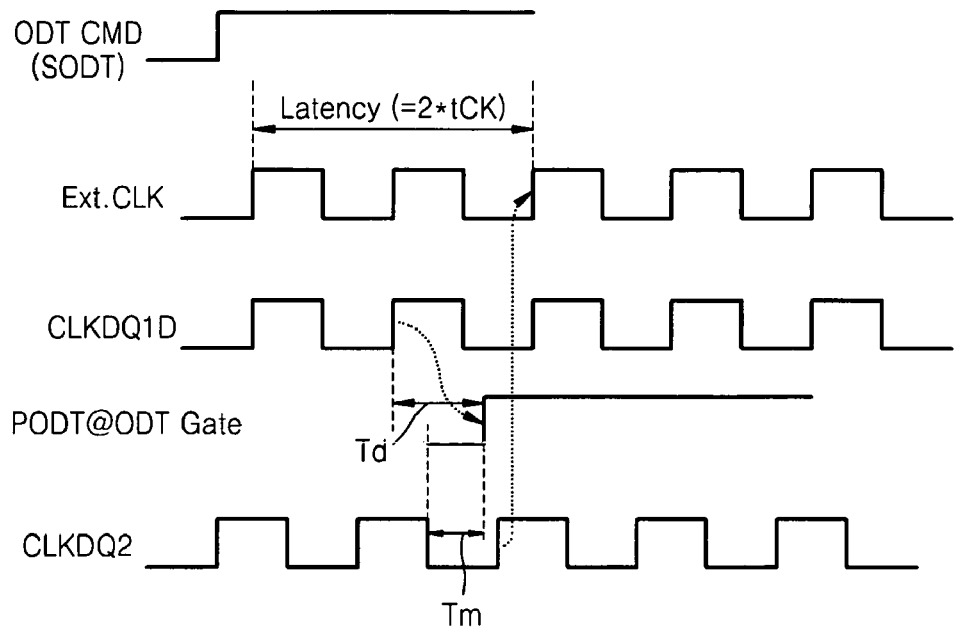
FIG. 3 is an example timing diagram of signals used in the ODT synchronous buffer illustrated in FIG. 2 in a higher frequency region.

FIG. 3 is an example timing diagram of signals used in the ODT synchronous buffer illustrated in FIG. 2 in a higher frequency region. A higher frequency may mean a frequency higher than a general reference frequency, for example, about 300 through 350 MHz.

An external ODT command ODT CMD and an external clock signal Ext CLK at a higher frequency may be applied to the ODT circuit including the ODT synchronous buffer. For example, the clock latency of the ODT circuit as illustrated in FIG. 1 may be assumed to correspond to two clock cycles after the external ODT command ODT CMD is applied. However, example embodiments are not limited thereto.

The synchronous ODT command PODT may be output in response to a rising edge of the first delayed clock signal CLKDQ1D output from the delay DELAY illustrated in FIG. 2. An absolute delay Td may exist between a time if the synchronous ODT command PODT is output in synchronization with the rising edge of the first delayed clock signal CLKDQ1D and a time if the synchronous ODT command PODT is arrives at the ODT gate 23 illustrated in FIG. 1. Accordingly, the synchronous ODT command PODT may be generated after the falling edge of the second clock signal CLKDQ2, which is generated first after the rising edge of the first delayed clock signal CLKDQ1D. For example, the synchronous ODT command PODT may be generated in a disabled period of the second clock signal CLKDQ2. Accordingly, the ODT gate 23 illustrated in FIG. 1 may generate the ODT up and down signals ODT_UP and ODT_DN in response to a rising edge of the second clock signal CLKDQ2, and/or the clock latency may be controlled to correspond to two clock cycles.

Figure 4:
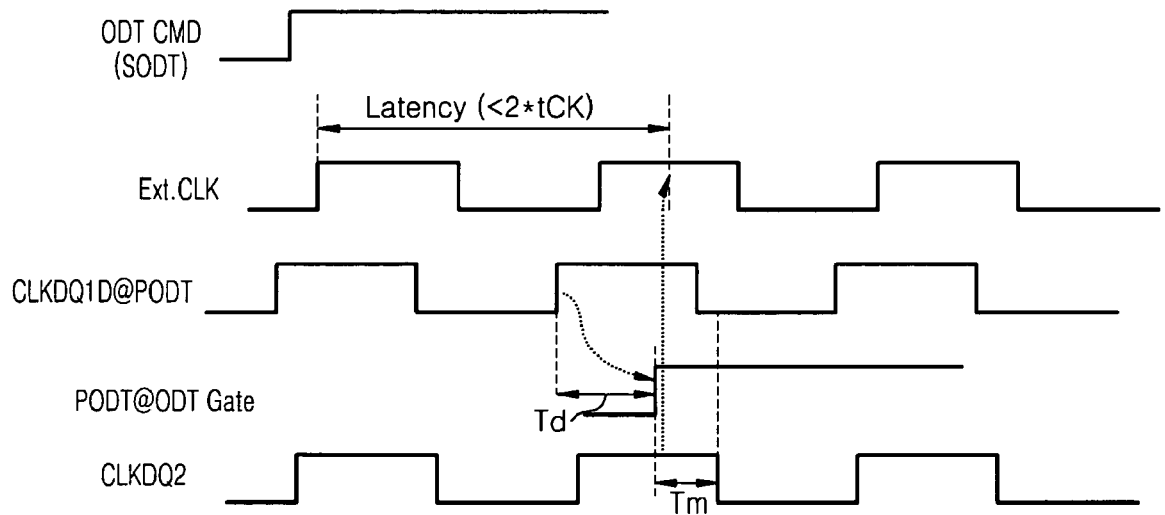
FIG. 4 is an example timing diagram of signals used in the ODT synchronous buffer illustrated in FIG. 2 in a lower frequency region.

FIG. 4 is an example timing diagram of signals used in the ODT synchronous buffer illustrated in FIG. 2 in a lower frequency region. Referring to FIG. 4, the synchronous ODT command PODT may be generated prior to the falling edge of the second clock signal CLKDQ2, which is generated first after the rising edge of the first delayed clock signal CLKDQ1D at which the synchronous ODT command PODT is output. For example, the synchronous ODT command PODT may be generated in an enabled period of the second clock signal CLKDQ2. Accordingly, the ODT gate 23 illustrated in FIG. 1 may operate in response to the enabled period of the second clock signal CLKDQ2. Therefore, the clock latency may become shorter than two clock cycles, and an operation failure may occur.

Figure 5:
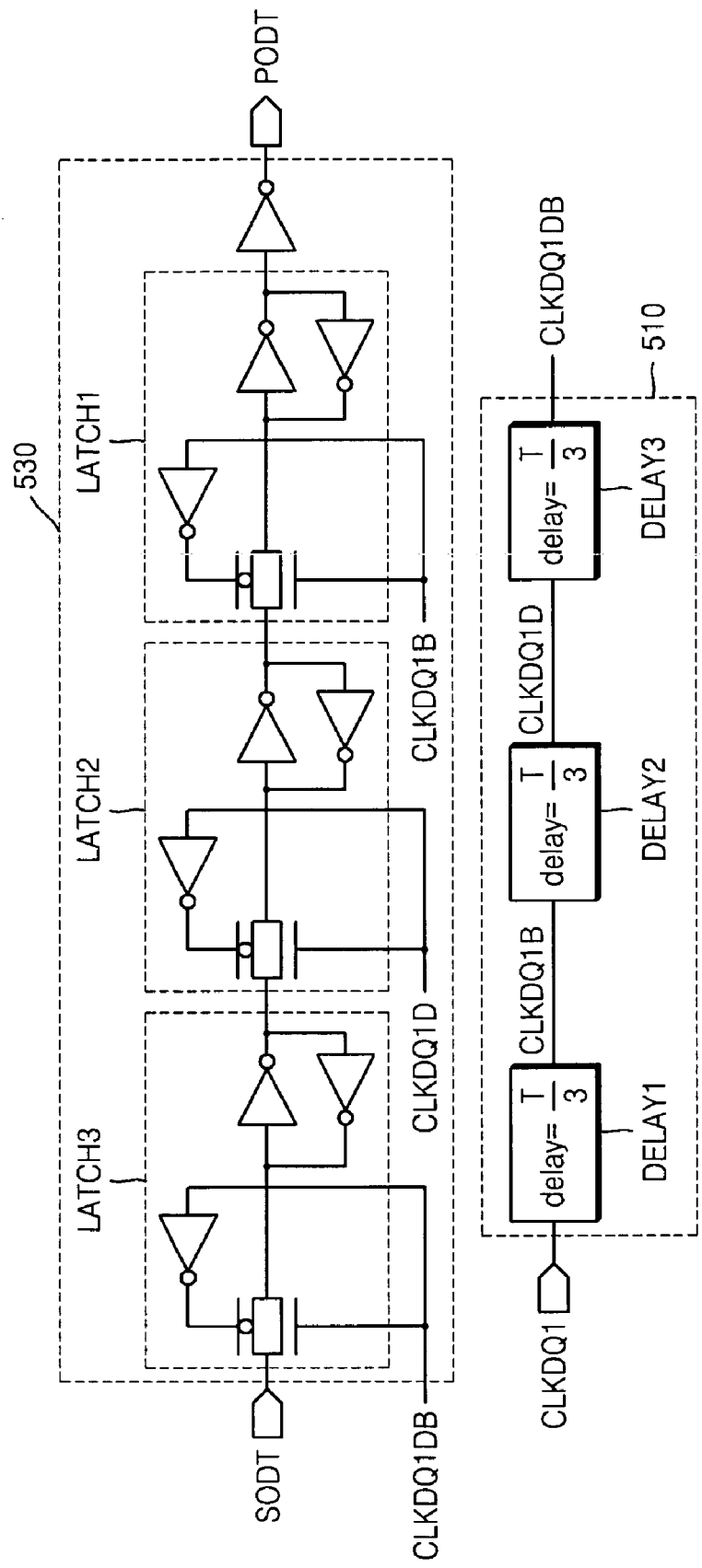
FIG. 5 is a circuit diagram of an ODT synchronous buffer according to an example embodiment.

FIG. 5 is a circuit diagram of an ODT synchronous buffer according to an example embodiment. Referring to FIG. 5, the ODT synchronous buffer according to an example embodiment may generate a synchronous ODT command PODT from an external ODT command, e.g., the output SODT, in synchronization with a first clock signal CLKDQ1 that is delay-locked to an external clock signal Ext CLK. The synchronous ODT command PODT may be generated in a disabled period of a second clock signal CLKDQ2. The ODT gate 23 illustrated in FIG. 1 may generate signals for controlling ODT (e.g., ODT up and down signals ODT_UP and ODT_DN) using the second clock signal CLKDQ2 delay-locked to the external clock signal Ext CLK and the synchronous ODT command PODT. The second clock signal CLKDQ2 may have a desired, or alternatively, a predetermined phase difference with the first clock signal CLKDQ1.

The ODT synchronous buffer according to an example embodiment may include a delay unit 510 and/or a latch unit 530. The delay unit 510 may delay the first clock signal CLKDQ1 to generate a first delayed clock signal CLKDQ1B. The latch unit 530 may latch the external ODT command SODT in response to the first delayed clock signal CLKDQ1B and/or output the latched external ODT command SODT as the synchronous ODT command PODT.

The delay unit 510 may include a first delay DELAY1, a second delay DELAY2, and/or a third delay DELAY3. The first delay DELAY1 may delay the first clock signal CLKDQ1 to generate a first delayed clock signal CLKDQ1B. The second delay DELAY2 may delay the first delayed clock signal CLKDQ1B to generate a second delayed clock signal CLKDQ1D. The third delay DELAY3 may delay the second delayed clock signal CLKDQ1D to generate a third delayed clock signal CLKDQ1DB.

The sum of delays of the first, second and third delays DELAY1, DELAY2 and DELAY3 may be identical to the delay of the delay DELAY of the ODT synchronous buffer illustrated in FIG. 2. The first, second and third delays DELAY1, DELAY2 and DELAY3 may have a same delay.

The first clock signal CLKDQ1 may have a phase difference of 180° with the first delayed clock signal CLKDQ1B, and/or the first delayed clock signal CLKDQ1B may have a phase difference of 180° with the second delayed clock signal CLKDQ1D. The second clock signal CLKDQ1D can have a phase difference of 180° with the third delayed clock signal CLKDQ1DB. For example, the first delayed clock signal CLKDQ1B may be obtained by delaying and inverting the first clock signal CLKDQ1, the second delayed clock signal CLKDQ1D may be obtained by delaying and inverting the first delayed clock signal CLKDQ1B, and/or the third delayed clock signal may be obtained by delaying and inverting the second delayed clock signal CLKDQ1D.

The latch unit 530 may include a first latch LATCH1, a second latch LATCH2, and/or a third latch LATCH3. The third latch LATCH3 may latch the external ODT command SODT in response to the third delayed clock signal CLKDQ1DB output from the third delay DELAY3. The second latch LATCH2 may latch the output signal of the third latch LATCH3 in response to the second delayed clock signal CLKDQ1D output from the second delay DELAY2. The first latch LATCH1 may latch the output signal of the second latch LATCH2 in response to the first delayed clock signal CLKDQ1B output from the first delay DELAY1 and output the latched signal as the synchronous ODT command PODT. The first latch LATCH1 may output the synchronous ODT command PODT in response to a rising edge of the first delayed clock signal CLKDQ1B.

The first latch LATCH1 may latch the output signal of the second latch LATCH2 in response to a falling edge of the first delayed clock signal CLKDQ1B output from the first delay DELAY1, and/or the latch output status may be changed at a rising edge of the first delayed clock signal CLKDQ1B. The second latch LATCH2 may latch the output signal of the third latch LATCH3 in response to a falling edge of the second delayed clock signal CLKDQ1D output from the second delay DELAY2, and/or the latch output status may be changed at a rising edge of the second delayed clock signal CLKDQ1D. The third latch LATCH3 may latch the output signal of the external ODT command SODT in response to a falling edge of the third delayed clock signal CLKDQ1DB output from the third delay DELAY3, and/or the latch output status may be changed at a rising edge of the third delayed clock signal CLKDQDB.

Figure 6:
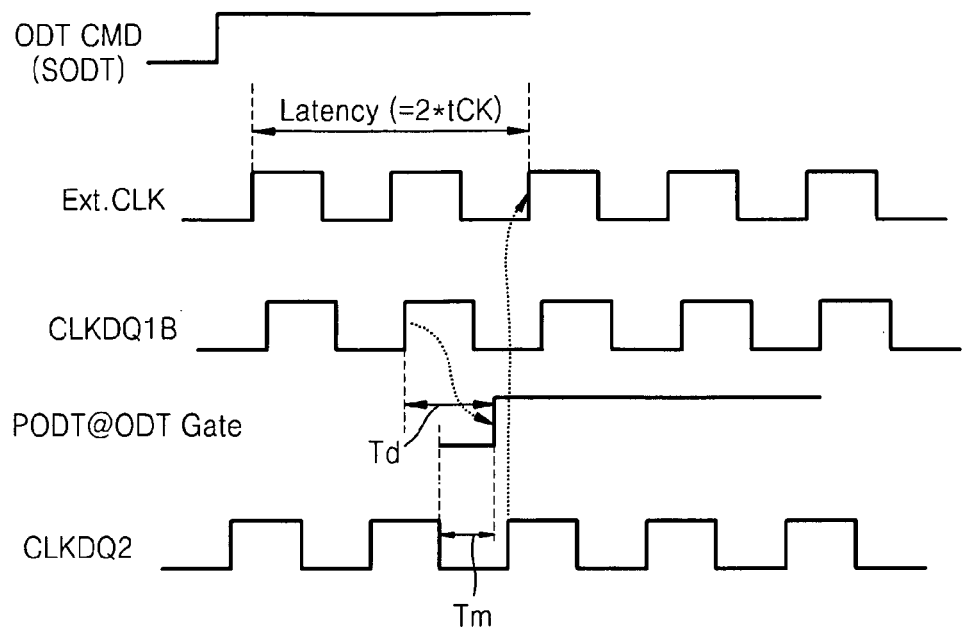
FIG. 6 is an example timing diagram of signals used in the ODT synchronous buffer illustrated in FIG. 5 in a higher frequency region.
Figure 7:
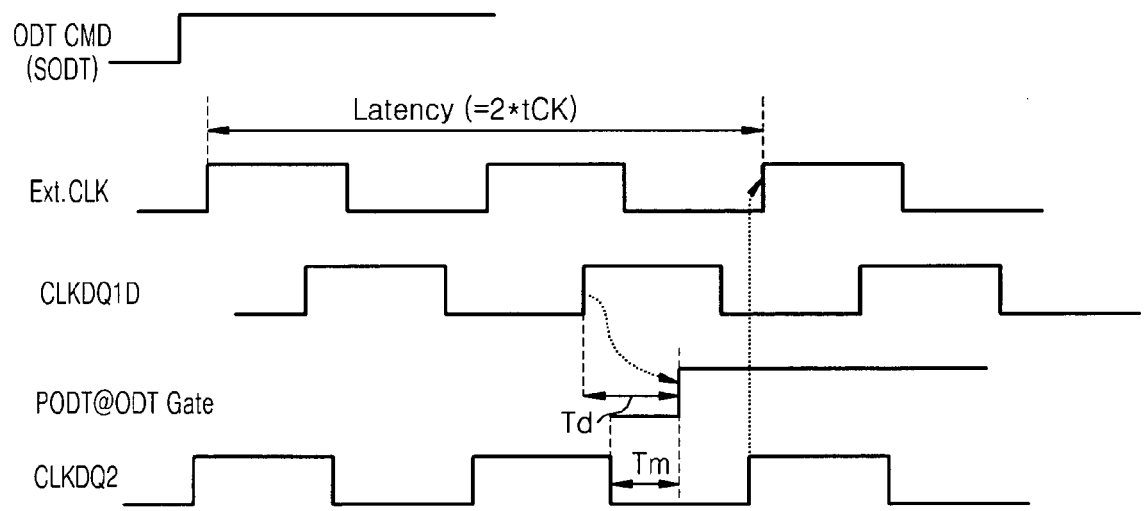
FIG. 7 is an example timing diagram of signals used in the ODT synchronous buffer illustrated in FIG. 5 in a lower frequency region.

FIG. 6 is an example timing diagram of signals used in the ODT synchronous buffer illustrated in FIG. 5 in a higher frequency region, and FIG. 7 is an example timing diagram of signals used in the ODT synchronous buffer illustrated in FIG. 5 in a lower frequency region. In FIGS. 6 and 7, the clock latency of the ODT circuit including the ODT synchronous buffer may be assumed to correspond to two clock cycles after the external clock signal Ext CLK is applied. However, example embodiments are not limited thereto. FIG. 6 illustrates a case where the external clock signal Ext CLK has a higher frequency and FIG. 7 illustrates a case where the external clock signal Ext CLK has a lower frequency.

Referring to FIGS. 6 and 7, the synchronous ODT command PODT may be generated in response to a rising edge of the first delayed clock signal CLKDQ1B output from the first delay DELAY1. Accordingly, an absolute delay Td of the synchronous ODT command PODT may start at the rising edge of the first delayed clock signal CLKDQ1B and end before the rising edge of the second clock signal CLKDQ2, which is generated first after the rising edge of the first delayed clock signal CLKDQ1B. The instant of time when the absolute delay Td ends may lag behind the falling edge of the second clock signal CLKDQ2, which leads the rising edge of the second clock signal CLKDQ2 by half the clock cycle (0.5*tCK). For example, a delay margin Tm may be greater than zero. Accordingly, the synchronous ODT command PODT is generated between the rising edge of the second clock signal CLKDQ2, which is generated first after the operation of the first latch LATCH1 illustrated in FIG. 5 and the falling edge of the second clock signal CLKDQ2, which leads the rising edge of the second clock signal CLKDQ2 by half the clock cycle (0.5*tCK). For example, the synchronous ODT command PODT may be generated in a disabled period of the second clock signal CLKDQ2. Accordingly, the clock latency may be controlled to correspond to two clock cycles.

The ODT synchronous buffer illustrated in FIG. 2 may generate the synchronous ODT command PODT in an enabled period of the second clock signal CLKDQ2 if the external clock signal Ext CLK has a lower frequency, and the clock latency may not be controlled to correspond to two clock cycles. However, the ODT synchronous buffer according to an example embodiment may generate the synchronous ODT command PODT in a disabled period of the second clock signal CLKDQ2 irrespective of the frequency of the external clock signal Ext CLK. For example, the ODT synchronous buffer according to an example embodiment may generate the synchronous ODT command PODT in synchronization with the first delayed clock signal CLKDQ1B having a delay shorter than that of the third delayed clock signal CLKDQ1DB. Accordingly, the synchronous ODT command PODT may be generated in a disabled period of the second clock signal CLKDQ1 and the clock latency may be controlled to correspond to two clock cycles.

As described above, the ODT circuit according to an example embodiment may operate in agreement with the clock latency without controlling the output signal of the ODT synchronous buffer constructing the ODT circuit in response to a frequency. Operation failure of the ODT circuit may be reduced.

Although example embodiments have been shown and described in this specification and figures, it would be appreciated by those skilled in the art that changes may be made to the illustrated and/or described example embodiments without departing from their principles and spirit.

What is claimed is:

1. An on-die termination (ODT) circuit, comprising:
   an ODT synchronous buffer configured to receive a first clock signal delay-locked to an external clock signal and configured to generate a synchronous ODT command from an external ODT command in synchronization with the first clock signal; and
   an ODT gate configured to receive a second clock signal delay-locked to the external clock signal and the synchronous ODT command and configured to generate signals for controlling the ODT based on the second clock signal and the synchronous ODT command, wherein
   the ODT synchronous buffer includes,
      a delay unit configured to generate a plurality of delayed clock signals from the first clock signal by sequentially delaying the first clock signal, and
      a latch unit including a plurality of latches, each of the plurality of latches configured to receive a corresponding one of the plurality of delayed clock signals from the delay unit,
   the delay unit is configured generate a first delayed clock signal of the plurality of delayed clock signals by delaying the first clock signal,
   a latch unit configured to latch the external ODT command in response to the first delayed clock signal and output the latched external ODT command as the synchronous ODT command,
   the delay unit includes,
      a first delay configured to delay the first clock signal to generate the first delayed clock signal,
      a second delay configured to delay the first delayed clock signal to generate a second delayed clock signal of the plurality of delayed clock signals, and
      a third delay configured to delay the second delayed clock signal to generate a third delayed clock signal of the plurality of delayed clock signals, and
   the latch unit includes,
      a third latch of the plurality of latches configured to latch the external ODT command in response to the third delayed clock signal output from the third delay,
      a second latch of the plurality of latches configured to latch the output signal of the third latch in response to the second delayed clock signal output from the second delay, and
      a first latch of the plurality of latches configured to latch the output signal of the second latch in response to the first delayed clock signal output from the first delay and output the latched signal as the synchronous ODT command.

2. The ODT circuit of claim 1, wherein the first, second and third delays have a same delay.

3. The ODT circuit of claim 1, wherein the first latch is configured to output the synchronous ODT command in response to a rising edge of the first delayed clock signal.

4. The ODT circuit of claim 1, wherein the second clock signal has a phase difference with the first clock signal.

5. An on-die termination (ODT) synchronous buffer, the ODT synchronous buffer comprising:
   a delay unit configured to delay a first clock signal delay-locked to an external clock signal to generate a first delayed clock signal; and
   a latch unit including a plurality of latches, where the latch unit is configured to latch an external ODT command in response to the first delayed clock signal and output the latched external ODT command as a synchronous ODT command, wherein
   the delay unit is configured to generate a plurality of delayed clock signals from the first clock signal by sequentially delaying the first clock signal, and
   the delay unit is configured to output the plurality of delayed clock signals respectively to the plurality of latches,
   the delay unit includes,
      a first delay configured to delay the first clock signal to generate the first delayed clock signal,
      a second delay configured to delay the first delayed clock signal to generate a second delayed clock signal of the plurality of delayed clock signals, and
      a third delay configured to delay the second delayed clock signal to generate a third delayed clock signal of the plurality of delayed clock signals, and
   the latch unit includes,
      a third latch of the plurality of latches configured to latch the external ODT command in response to the third delayed clock signal output from the third delay,
      a second latch of the plurality of latches configured to latch the output signal of the third latch in response to the second delayed clock signal output from the second delay, and
      a first latch of the plurality of latches configured to latch the output signal of the second latch in response to the first delayed clock signal output from the first delay and output the latched signal as the synchronous ODT command.

6. An on-die termination circuit, comprising:
   the ODT synchronous buffer of claim 5.

7. A method of controlling an on-die termination (ODT) circuit, the method comprising:
   generating a synchronous ODT command from an external ODT command in synchronization with a first clock signal delay-locked to an external clock signal; and
   generating signals for controlling the ODT based on a second clock signal delay-locked to the external clock signal and the synchronous ODT command, wherein the generating the synchronous ODT command includes generating a plurality of delayed clock signals from the first clock signal by sequentially delaying the first clock signal, and the generating the synchronous ODT command includes outputting the plurality of delayed clock signals respectively to a plurality of latches, the generating the plurality of delayed clock signals includes, first delaying the first clock signal to generate a first delayed clock signal of the plurality of delayed clock signals, second delaying the first delayed clock signal to generate a second delayed clock signal of the plurality of delayed clock signals, and third delaying the second delayed clock signal to generate a third delayed clock signal of the plurality of delayed clock signals, and the generating the synchronous ODT command includes, first latching the external ODT command in response to the third delayed clock signal, second latching the output signal of the first latching in response to the second delayed clock signal, and third latching the output signal of the second latching in response to the first delayed clock signal and outputting the latched signal as the synchronous ODT command.

\* \* \* \* \*